(12) United States Patent
Wong et al.

(10) Patent No.: US 7,679,061 B2
(45) Date of Patent: Mar. 16, 2010

(54) RADIOGRAPHIC IMAGE SENSING SYSTEM

(75) Inventors: Victor C. Wong, Rochester, NY (US); Rongguang Liang, Penfield, NY (US)

(73) Assignee: Carestream Health, Inc., Rochester, NY (US)

( * ) Notice: Subject to any disclaimer, the term of this patent is extended or adjusted under 35 U.S.C. 154(b) by 264 days.

(21) Appl. No.: 11/285,258

(22) Filed: Nov. 22, 2005

(65) Prior Publication Data

US 2007/0114425 A1    May 24, 2007

(51) Int. Cl.
*G01T 1/20* (2006.01)
(52) U.S. Cl. .............................. 250/370.11; 250/370.09; 250/370.08; 359/742
(58) Field of Classification Search .................. None
See application file for complete search history.

(56) References Cited

U.S. PATENT DOCUMENTS

| | | | | |
|---|---|---|---|---|
| 4,068,126 A | * | 1/1978 | Wilson | 250/363.02 |
| 4,636,644 A | * | 1/1987 | Stokes | 250/368 |
| 4,755,921 A | * | 7/1988 | Nelson | 362/307 |
| 5,418,377 A | | 5/1995 | Tran et al. | |
| 5,519,227 A | | 5/1996 | Karellas | |
| 6,178,224 B1 | | 1/2001 | Polichar et al. | |
| 6,407,860 B1 | * | 6/2002 | Funazaki et al. | 359/457 |
| 6,534,772 B1 | * | 3/2003 | Chhabra et al. | 250/367 |
| 2004/0042585 A1 | | 3/2004 | Nagarkar et al. | |
| 2004/0227990 A1 | * | 11/2004 | Peterson et al. | 359/457 |
| 2005/0181128 A1 | * | 8/2005 | Nikolov et al. | 427/248.1 |
| 2006/0056185 A1 | * | 3/2006 | Morino et al. | 362/332 |
| 2006/0138335 A1 | * | 6/2006 | Vogtmeier et al. | 250/370.11 |

OTHER PUBLICATIONS

Fresnel Lenses: High Quality Fresnel Lenses in a Variety of Sizes and Focal Lengths, Copyright 2003; Fresnel Technologies, Inc. pp. 2-12.*
T. Yu et al.; Scintillating fiber optic screens: A comparison of MTF, light conversion efficiency, and emission angle with $Gd_2O_2S$:Tb screens; Medical Physics, vol. 24, No. 2, Feb. 1997, pp. 279-285.

* cited by examiner

*Primary Examiner*—David P Porta
*Assistant Examiner*—Yara B Green

(57) ABSTRACT

An x-ray imaging source comprises a radiation source (12) providing x-ray radiation. A substrate comprised of a scintillating material (16) responsive to a level of incident radiation provides output light according to the level of incident radiation. A Fresnel lens (40) is disposed proximate to the substrate for directing the output light toward a second lens. The second lens directs the output light to an image sensor for converting light levels to the digital data, forming an image thereby.

21 Claims, 15 Drawing Sheets

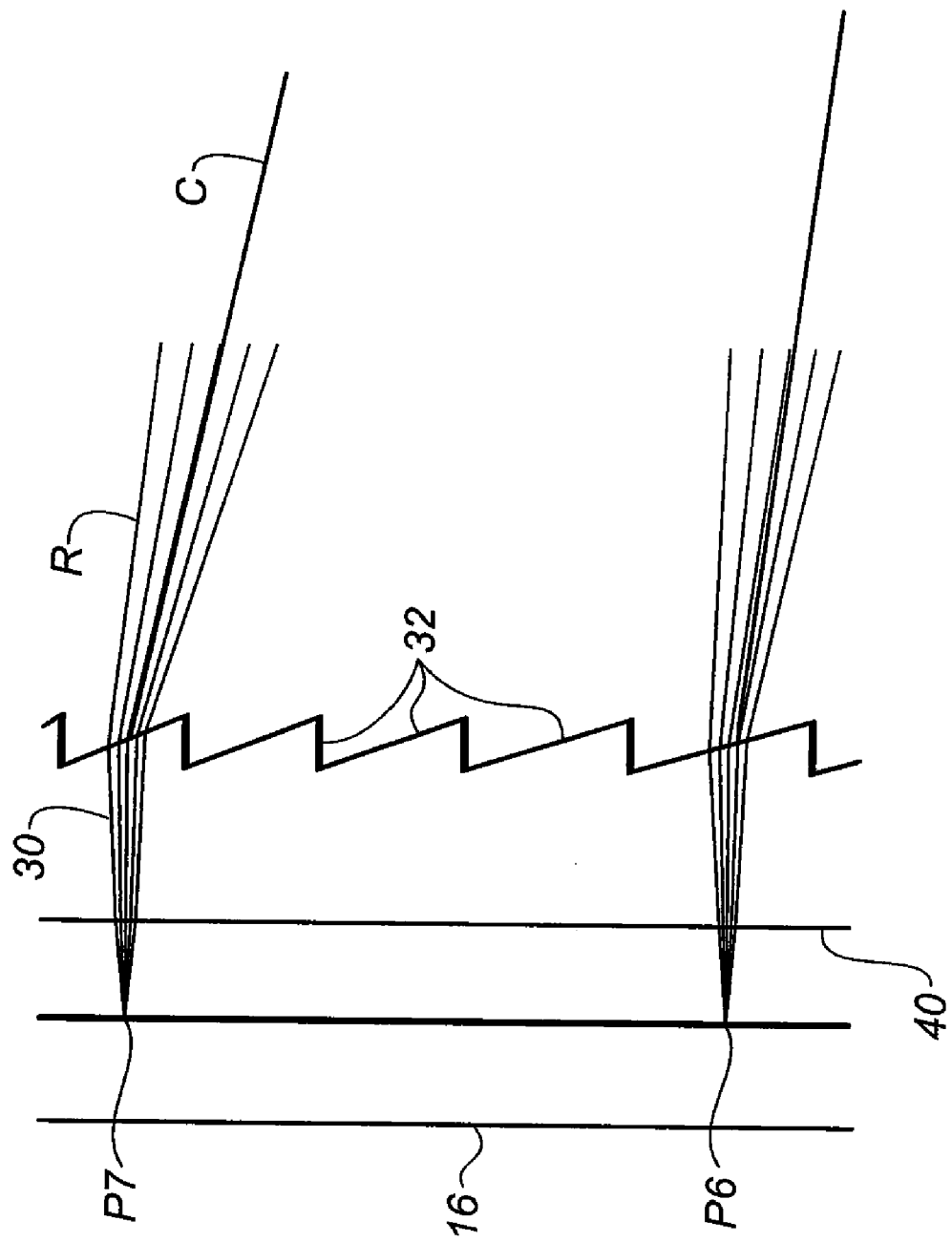

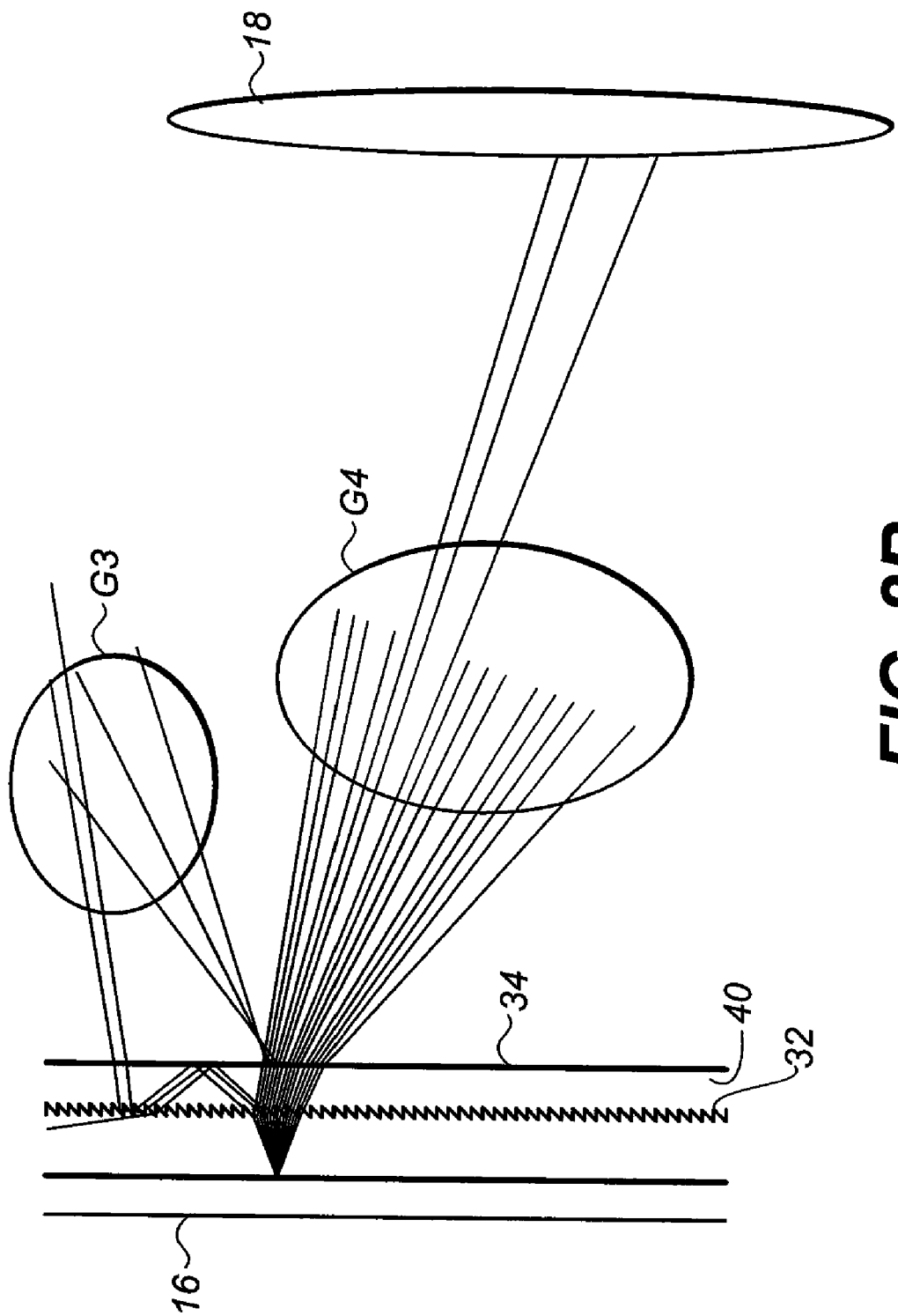

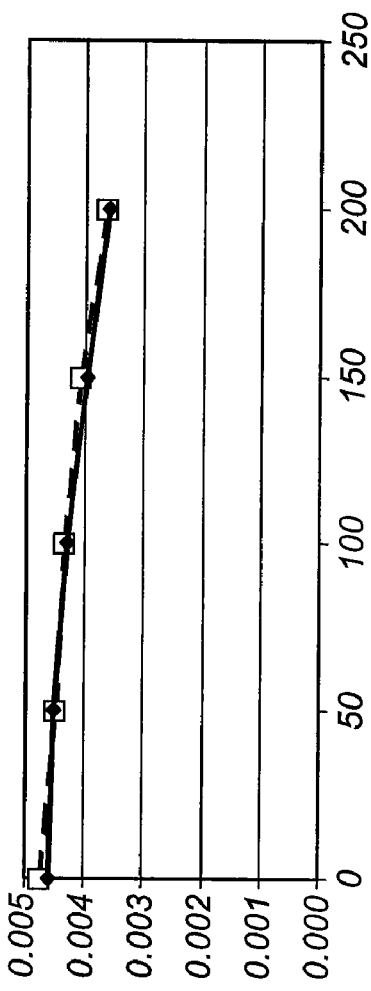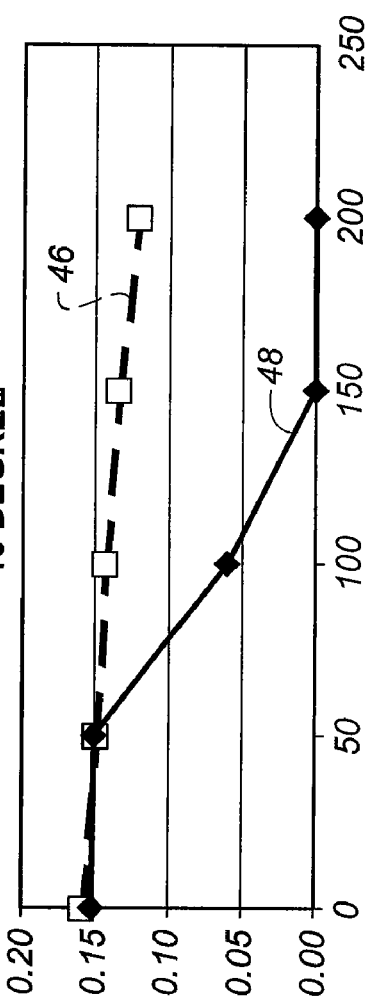
FIG. 9A
FIG. 9B

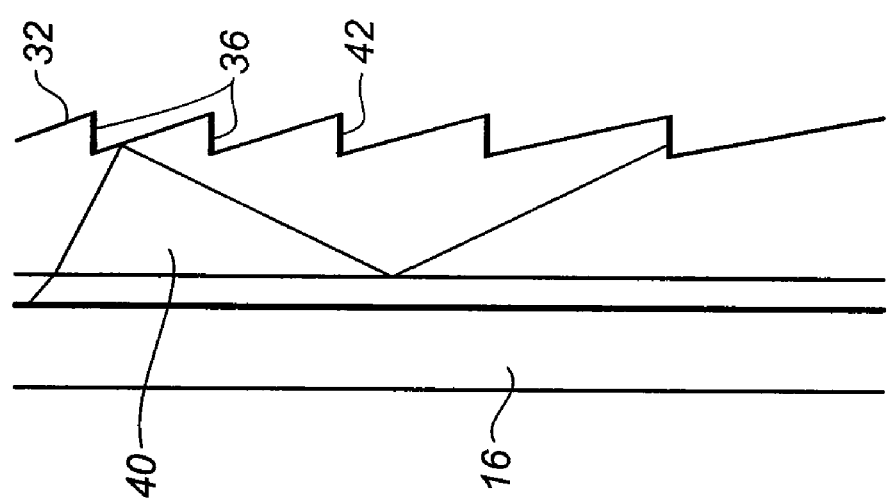

RADIOGRAPHIC IMAGE SENSING SYSTEM

FIELD OF THE INVENTION

This invention generally relates to radiographic imaging and more particularly to an imaging apparatus for providing radiographic images with improved optical efficiency.

BACKGROUND OF THE INVENTION

Digital radiography (DR) systems are enjoying growing acceptance as clinical imaging tools. As shown in the simplified block diagram of FIG. 1, radiation from x-ray source 12 in a lens-coupled DR imaging apparatus 10 is passed through a subject 14 and impinges upon a scintillator screen 16, converting the energy from ionized radiation into light radiation having different frequencies, typically within the visible spectrum. In lens-coupled DR imaging apparatus 10, this emitted light energy is directed, through a lens system 18, to an image sensing apparatus 20 that then forms a digital image from the emitted light. Unlike conventional x-ray film apparatus, DR imaging apparatus 10 does not require a separate processing area or image processing consumables. Another advantage of DR imaging technology is speed, since images are obtained immediately after the x-ray exposure. For medical applications, an image can be provided to medical personnel while a patient is still present at an imaging facility.

While there are inherent advantages to DR imaging, however, there is a need to improve the overall performance of lens-coupled DR systems. One area of particular interest relates to the amount of light that lens system 18 channels from scintillator screen 16 to image sensing apparatus 20, commonly characterized in terms of optical coupling efficiency. As a rule, optical efficiency directly affects the image quality of the DR system. Improvements in optical coupling efficiency may result in improved diagnostic capability and can advantageously also reduce radiation dosage requirements in many cases.

To date, conventional lens-coupled DR systems, as shown in FIG. 1, have exhibited relatively low optical coupling efficiencies for a number of reasons. Referring to FIG. 2, light emission from a pixel 24 on scintillator screen 16 is divergent. Thus, a large fraction of the light from scintillator screen 16 is emitted at angles that exceed the light-gathering capability of standard lens components of lens system 18. Also, as shown in FIG. 3, the size of lens system 18 is often considerably smaller than scintillator screen 16 due to cost, space, and manufacturing constraints. Rays emitting from the outer regions of scintillator screen 16, such as pixels 25 and 25', even at small emission angles, totally miss lens system 18. Thus, for the reasons shown in FIGS. 2 and 3, a large portion of the emitted light from scintillator screen 16 never reaches image sensing apparatus 20.

There have been a number of efforts at improving the optical coupling efficiency of lens-coupled DR imaging systems. One approach is directed to reducing the angular spread of the emission by controlling the structure of scintillator screen 16 itself. Examples of this approach include the following:

U.S. Pat. No. 5,519,227 (Karellas) discloses a laser-based micro-machining process for reducing spatial dispersion and scattering;

U.S. Pat. No. 5,418,377 (Tran et al.) discloses another method for treating phosphorus sites on the scintillator screen to reduce scattered luminescent radiation; and, U.S. Patent Application Publication No. 2004/0042585A1 (Nagarkar et al.) discloses processing a columnar structured material to reduce crosstalk and enhance collection efficiency. Medical Physics Journal article "Scintillating fiber optic screens: a comparison of MTF, light conversion efficiency, and emission angle with $Gd_2O_2S$: Tb screens" Vol. 24, Number 2, February, 1991, pages 279-285, discloses scintillating fiber optic screens having forward-directed emission distributions.

Another approach for improving optical coupling efficiency has been to improve the performance of collection optics themselves. As shown in FIG. 2, the emissive surface of scintillator screen 16 broadcasts light over a wide range of angles. Any type of collection optics must collect as much of the emitted light as possible and direct the light to image sensing apparatus 20, while keeping crosstalk between pixels to a minimum. As one example of an approach to improving collection optics, U.S. Pat. No. 6,178,224 (Polichar et al.) discloses the use of an emission modification layer positioned near the scintillation layer to limit the divergence of the emitted light. As embodiments of this emission modification layer, the Polichar et al. '224 disclosure mentions using various types of brightness enhancement film (BEF) and lenslet array or microsphere array structures.

While the approach described in the Polichar et al. '224 disclosure may improve total brightness from increased optical coupling, however, there are drawbacks for imaging when using the particular types of solutions proposed. In particular, with any of the disclosed embodiments of the Polichar et al. '224 disclosure, an increase in brightness comes at the price of lost contrast. This is because the predominant contribution to brightness increase for BEF components comes not from the BEF's divergence narrowing action, but from recycling of light rays that have undergone total internal reflection (TIR), which causes undesirable pixel crosstalk. This is illustrated in greater details by ray trace plots in FIGS. 5A and 5B. FIG. 5A shows how light from different points on the surface of scintillator screen 16 is directed through a BEF 26 having light-redirecting prisms 28, as disclosed in Polichar et al. '224. Light rays R from pixel P1, initially emitted over a fairly broad range of angles, are conditioned by BEF 26 and redirected toward normal, so that the divergence angle of light decreases from the original divergence angle shown as $\alpha_1$ to a smaller divergence angle $\alpha_2$. On the other hand, light rays from pixel P2 does not get redirected toward normal, in fact emerging from BEF 26 at an angle $\beta_2$ larger than the original divergence angle $\beta_1$. It can be observed that BEF 26, then, produces narrowing of the divergence of the emitted light from scintillator screen 16 only for certain pixel locations, depending on the relative positions of the pixels with respect to the light-redirecting prisms 28. Even for those light cones where divergence narrowing takes place, such as from pixel P1, the centroid remains forward-directing and does not get bent toward the center of lens system 18, contrary to what is discussed in Polichar et al. '224. A substantial part of the light cone still misses lens system 18, as shown in FIG. 5A. It is thus clear that the divergence narrowing action of the BEF 26 by itself is limited in effectiveness in increasing light throughput.

FIG. 5B shows how total internal reflection (TIR) in BEF, as used in Polichar et al. '224, decreases contrast. Light from pixel P3 enters BEF 26 at a number of angles. Some rays (R3 and R4) undergo refraction at the exit surface of BEF 26 and can be imaged by lens system 18 to form the image of P3 on image sensing apparatus 20 (not shown in FIG. 5B). Other rays undergo TIR at surfaces of BEF 26, and backscatter from scintillator screen 16 at positions different from P3. These recycled rays (R1 and R2) re-emerge from BEF 26 to be directed to image sensing apparatus 20 by lens system 18.

However, R1 and R2 will be imaged to image sensing apparatus 20 at points other than the image of P3; this constitutes undesirable pixel crosstalk that degrades image contrast.

Emission modification layers using lenslet or microsphere array structures, as disclosed in Polichar et al. '224, suffer similar deficiencies as using BEF 26.

Thus, it can be seen that while solutions for improved optical coupling have been proposed, there is room for improvement, particularly with respect to improving optical coupling efficiency while maintaining image contrast.

SUMMARY OF THE INVENTION

Briefly, according to one aspect of the present invention, x-ray imaging system incorporates:
  a) a radiation source providing x-ray radiation;
  b) a substrate comprised of a scintillating material responsive to the level of incident radiation and providing output light according to the level of incident radiation;
  c) a Fresnel lens disposed proximate the substrate, for directing the output light toward a second lens; and
  d) the second lens directing the output light to an image sensor for converting light levels to digital data, forming an image thereby.

It is a feature of the present invention that it uses a Fresnel lens to focus light from the scintillator screen surface toward the image sensing apparatus.

It is an advantage of the present invention that it improves optical efficiency of the lens-coupled DR system without degrading system contrast. Improved optical efficiency means the radiographic image would have higher image quality, and potentially, lower radiation dosage would be needed for obtaining an image from a human patient.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

FIGS. 6A and 6B are diagrams showing ray traces of emitted light using a Fresnel lens according to the present invention;

FIG. 8B is a side view showing ray traces through a Fresnel lens oriented with the ridge side facing scintillator screen;

FIGS. 9A and 9B are a set of graphs showing efficiency of light coupling, with and without the use of Fresnel lens, in DR imaging system with scintillator screen having large and small divergence;

FIG. 12 is a close-up side view of a Fresnel lens adapted to prevent TIR-induced light from exiting through the draft surfaces.

DETAILED DESCRIPTION OF THE INVENTION

The present description is directed in particular to elements forming part of, or cooperating more directly with, apparatus in accordance with the invention. It is to be understood that elements not specifically shown or described may take various forms well known to those skilled in the art.

Figure 1:
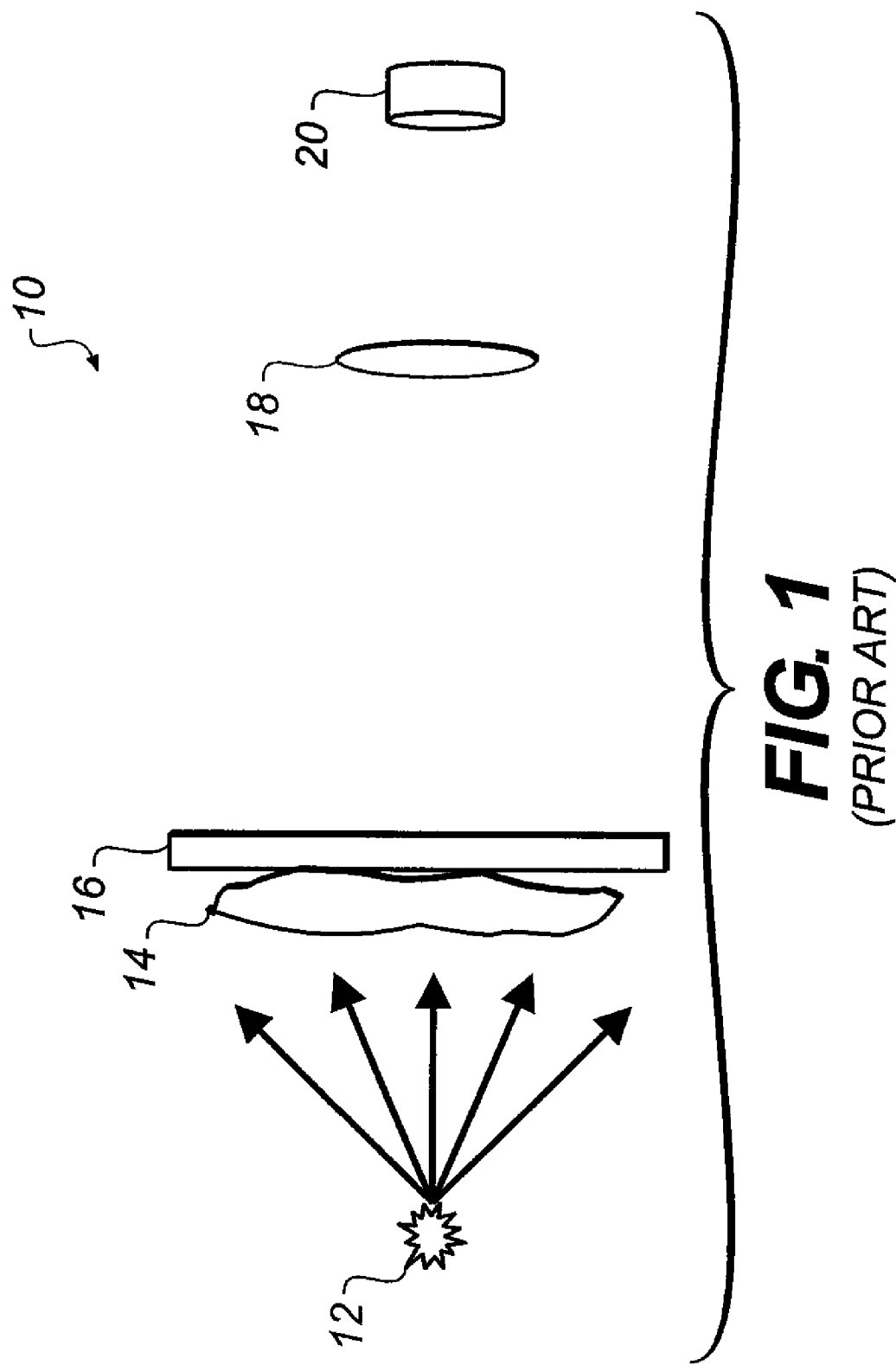
FIG. 1 is a simplified block diagram of a conventional lens-coupled DR imaging system.
Figure 2:
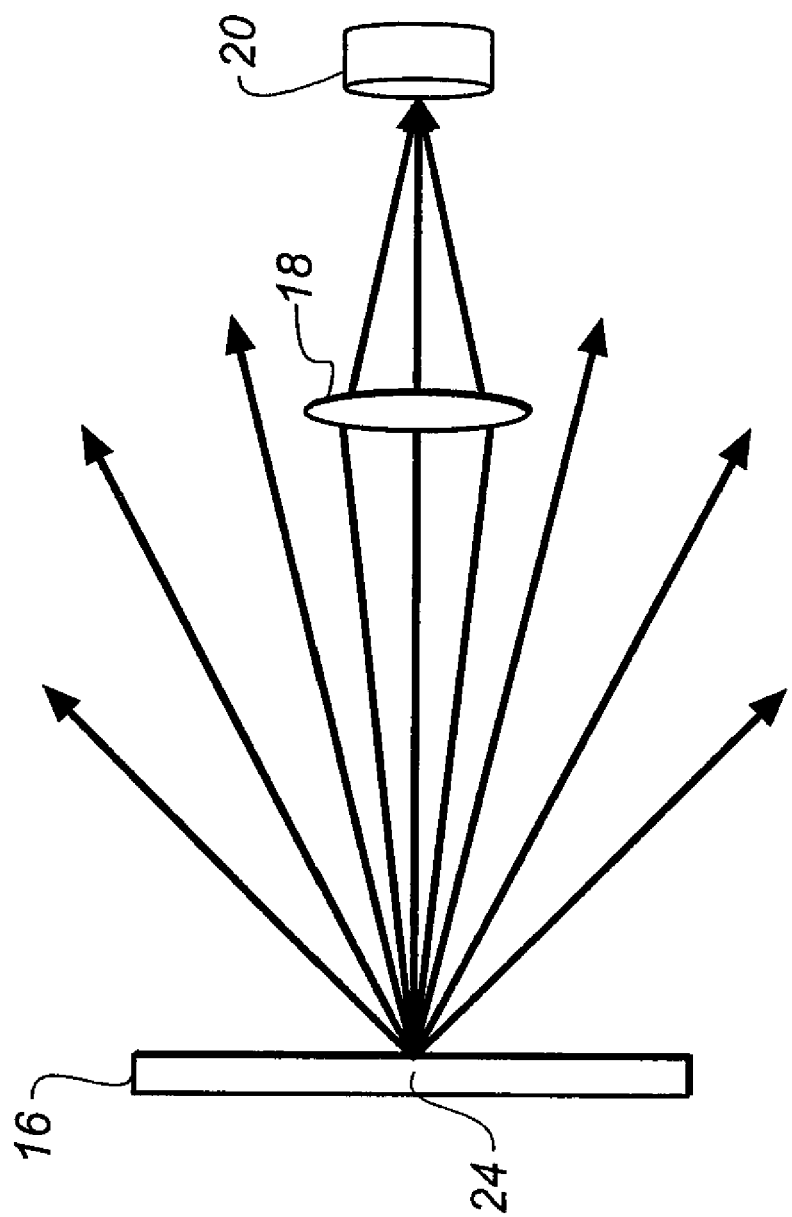
FIG. 2 is a block diagram showing angular dispersion of light emission from a point on scintillator screen.
Figure 3:
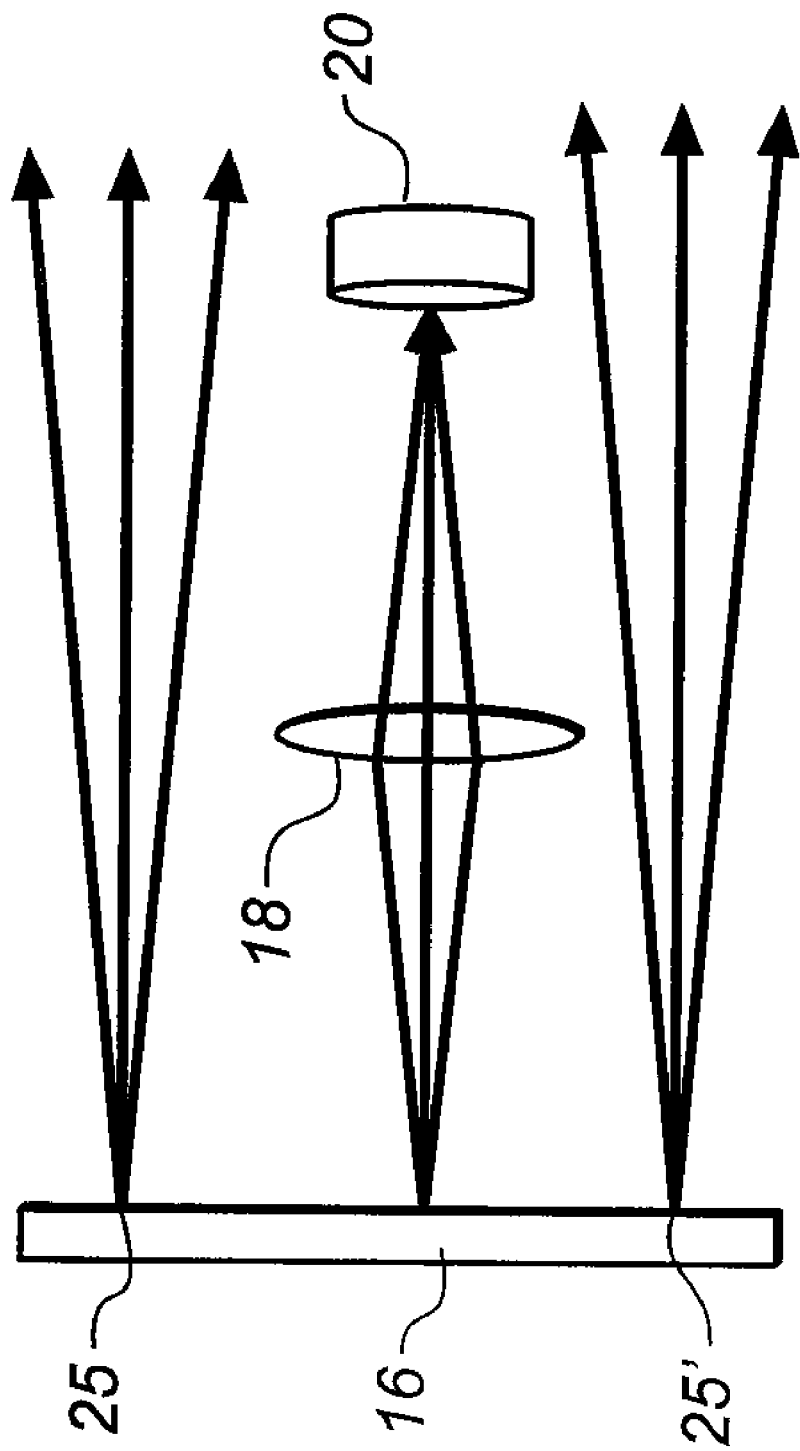
FIG. 3 is a block diagram showing angular dispersion of light emission from three points on scintillator screen.
Figure 4:
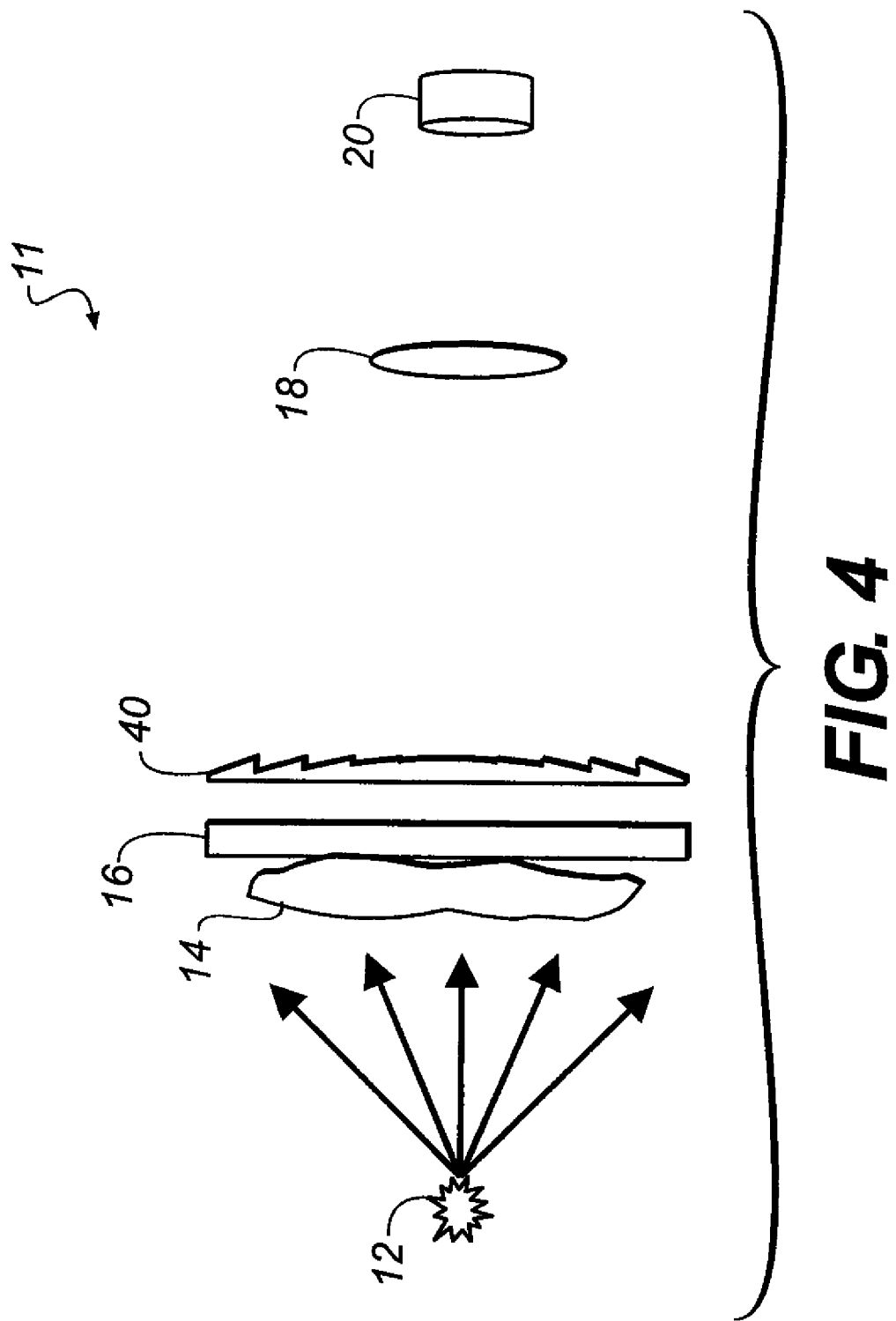
FIG. 4 is a block diagram showing a lens-coupled DR imaging system with the incorporation of a Fresnel lens, according to the present invention.
Figure 5A:
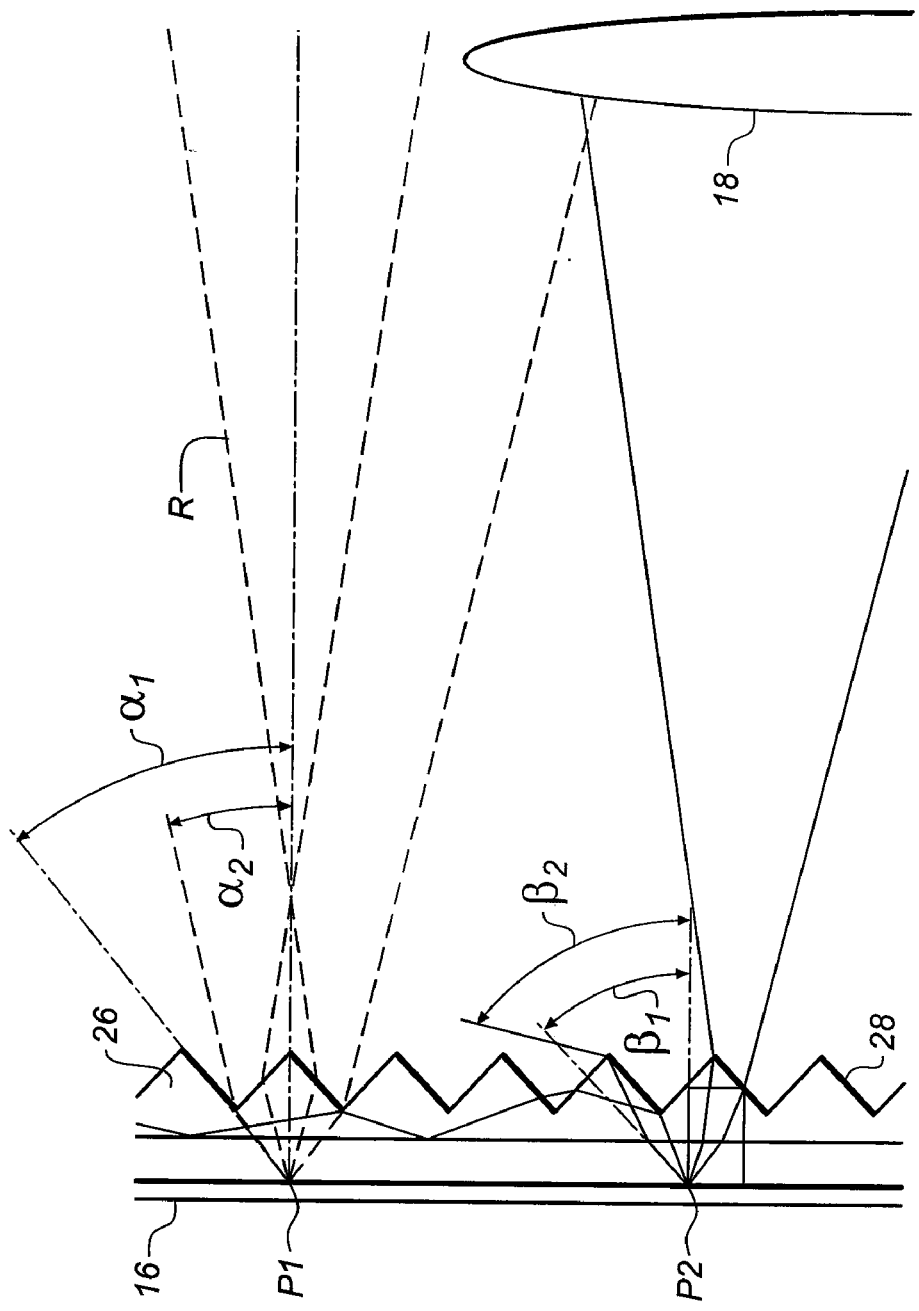
FIGS. 5A and 5B show redirection of emitted light using a brightness enhancement film or similar article according to Polichar et al. '224.
Figure 5B:
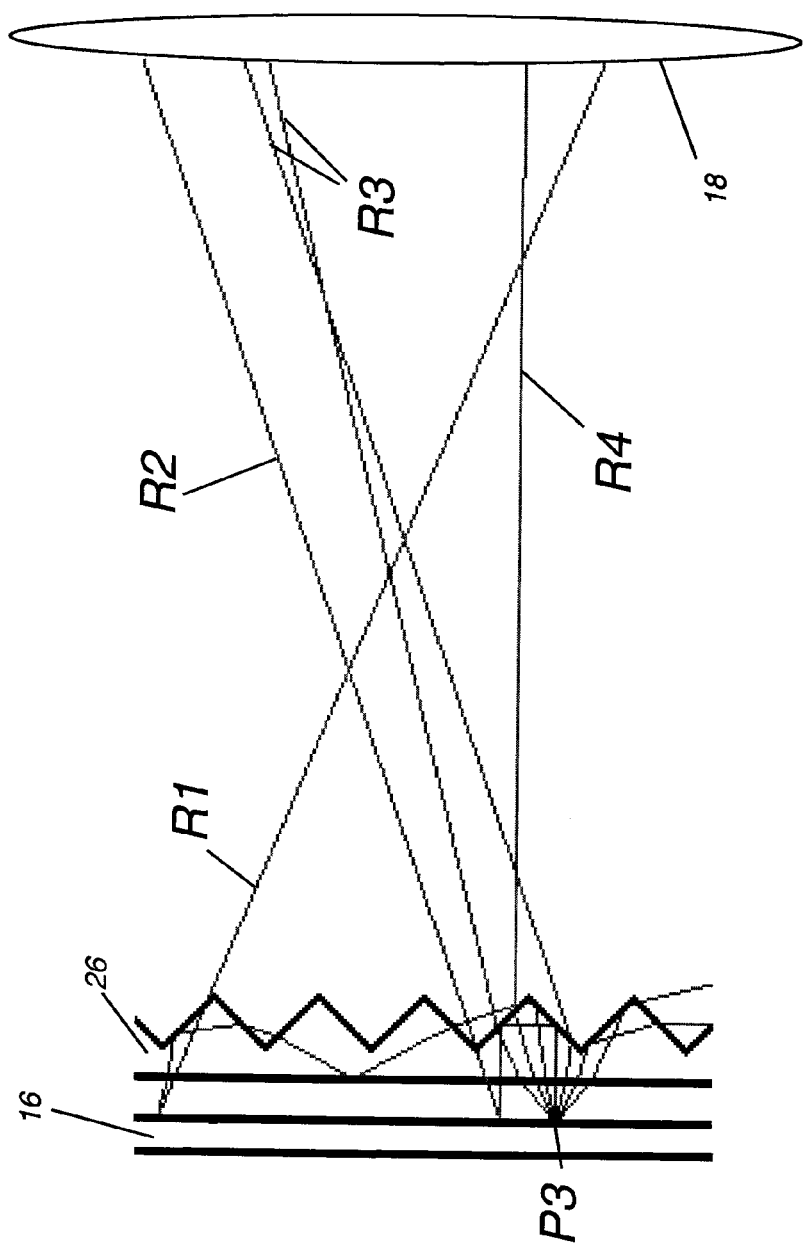

Referring to FIG. 4, there is shown an arrangement of lens-coupled DR imaging apparatus 11 components according to the present invention. A Fresnel lens 40 is disposed adjacent scintillator screen 16 for focusing the emitted light. Fresnel lens 40 has a size preferably as large as scintillator screen 16, but at least as large as the imaging area of interest. It bends the emitted light toward lens system 18 to increase the amount of light channeling into image sensing apparatus 20. Lens system 18 is positioned to produce a demagnified image of scintillator screen 16 on image sensing apparatus 20. Fresnel lens 40 is chosen to have a focal length about equal to the separation between scintillator screen 16 and lens system 18. Optional mirrors (not shown) could be used to fold the light path going from Fresnel lens 40 to lens system 18, and/or to fold the light path going from lens system 18 to image sensing apparatus 20.

Figure 11:
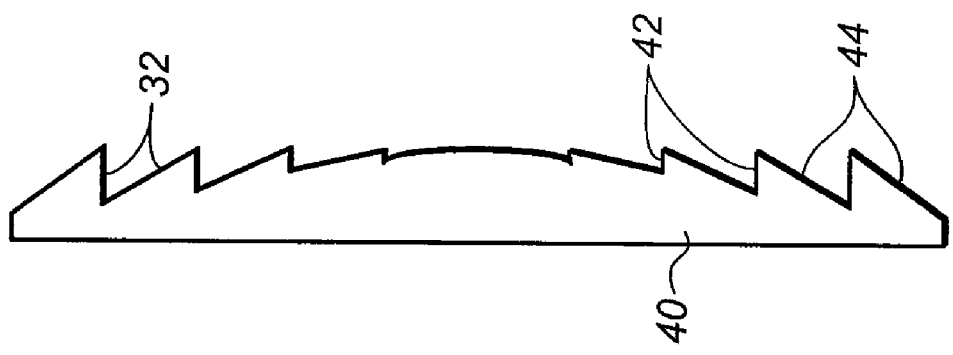
FIG. 11 is a side view showing the basic anatomy of a Fresnel lens in cross section.

Referring to FIG. 11, Fresnel lens 40 is a spherically symmetric optical element. One side of Fresnel lens 40 is flat; the other side consists of generally concentric ridges 32, centered about its normal axis, each ridge 32 being a light-refracting structure. The Fresnel shape can be approximated as a lens cut into narrow, concentric rings and flattened. Each ridge 32 forms a refractive structure corresponding to the angle of a slope 44 of its "ring." Moving from the outermost ridge toward center, the angle of each slope gets progressively smaller with respect to the flat side, with the center structure being flat (zero slope). As such, outer ridge 32 structures of the lens cause correspondingly more light-bending than do inner ridge 32 structures. A draft portion 42, having an angle close to a normal, then defines the boundary between ridges 32. Fresnel lens 40 is typically manufactured as a sheet of optical quality plastic. A Fresnel lens 40 having the size of a conventional scintillator screen 16 and having high focusing power can be readily obtained from any of a number of manufacturers, such as Reflexite Display Optics of Rochester, N.Y.

Referring again to FIG. 4, Fresnel lens 40 acts like a field lens, intercepting the light emission of scintillator screen 16 and refracting the emitted light toward lens system 18. A conventional lens performing the same function would be prohibitively thick, large, heavy, and costly. Advantageously, Fresnel lens 40 is considerably thinner, lighter, and lower cost than its conventional lens counterpart having the same diameter and focusing power.

In the preferred embodiment, Fresnel lens 40 is positioned immediately after scintillator screen 16. Fresnel lens 40 can be placed against scintillator screen 16 or physically separated from scintillator screen 16 by a small distance. Alternatively, Fresnel lens 40 can be glued or laminated onto scintillator screen 16 to form a single compact unit.

Fresnel lens 40 is widely used in illumination and projection applications. In the present invention, it is adapted for use in a DR imaging system. As will be taught subsequently, proper implementation of the Fresnel lens 40 brings significant improvement to the DR imaging system 11.

Figure 6A:
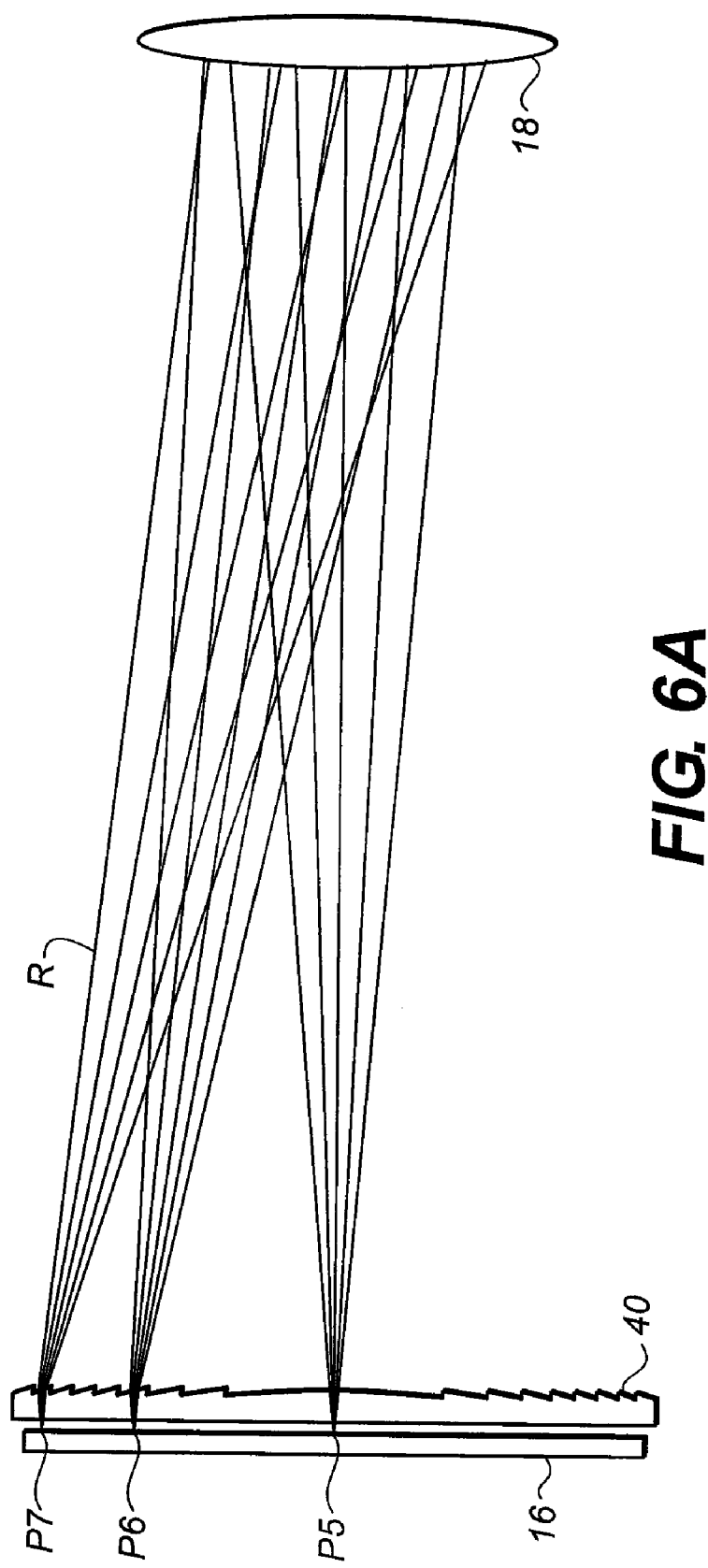

FIGS. 6A and 6B show the response of emitted light rays R that are incident on Fresnel lens 40. FIG. 6A traces rays emitting from three points P5, P6, and P7 on scintillator screen 16 and propagating through Fresnel lens 40 to lens system 18. As is shown best in the magnified view of FIG. 6B, rays R from off-axis point P7 in scintillator screen 16 undergo a change in direction through light bending action of Fresnel lens 40. That is, centroid C of light cone 30 is redirected toward the focus of Fresnel lens 40. Similar light bending occurs for the light cone from off-axis point P6, but by a smaller amount, since P6 is closer to the center of Fresnel lens 40 than point P7. The light cone from on-axis point P5 experiences no bending.

The focusing effect of Fresnel lens 40, therefore, is to direct the centroids of the light cones emitting from each point on scintillator screen 16 toward the center of lens system 18. This decreases the overall angular distribution of the scintillator screen 16 emission. Light from the outer part of the field, that otherwise would not get collected by lens system 18, are brought within the light acceptance angle of lens system 18. The net effect is that a substantially larger portion of the emitted light are collected, thereby increasing optical throughput of the system.

Significantly, the optical coupling efficiency increase is achieved in the present invention purely from the ray bending action of Fresnel lens 40. Because ray bending by Fresnel lens 40 does not mix the spatial ordering of the rays, unlike the TIR action relied upon by the Polichar et al. '224 application, the use of Fresnel lens 40 does not cause the adverse effects of pixel crosstalk. The present invention thus realizes the optical efficiency improvement without compromising system contrast.

Optimal optical efficiency of DR imaging system 11 depends on the inter-working relationship between lens system 18, Fresnel lens 40, and scintillator screen 16. The f-number of lens system 18 determines the light acceptance angle. Because of manufacturing, image quality, and cost requirements, lens system 18 is limited to an f-number of about 1. With such a lens system 18, Fresnel lens 40 is most effective in increasing light coupling when used with scintillator screen 16 having smaller divergence, or more forward-directed emission distribution.

Referring to FIGS. 9A and 9B, there are shown comparative plots of optical coupling efficiency as a function of field position (where 0 is the center of scintillator screen 16, and 200 is the position of scintillator screen 16 200-mm away from center), when using the approach of the present invention with scintillator screen 16 having two different divergence characteristics. Data for these plots are generated from ray tracing results for a DR system having lens system 18 with f-number=1 and demagnification factor=7.6. FIG. 9A shows the plots of the calculated coupling efficiency, with and without Fresnel lens 40, for a DR imaging system where scintillator screen 16 has Lambertian emission with a divergence angle of +/−90 degrees. As the graph indicates, there is little measurable efficiency improvement when scintillator screen 16 has Lambertian emission with large divergence angle.

In FIG. 9B, a dotted line curve 46 shows relative optical coupling efficiency of the DR system 11 with a Fresnel lens 40, where scintillator screen 16 has a Lambertian emission with small divergence angle of +/−10 degrees. A solid line curve 48 shows relative optical efficiency for the same system without the use of Fresnel lens 40. Improvement in coupling efficiency from the use of Fresnel lens 40 is clear and significant for off-axis field positions.

As was noted in the background section given above, there have been attempts to reduce the angular emission spread of scintillator screen 16. The attempts have been successful in producing scintillator screens 16 whose light emission distribution is more forward-directed. By using such scintillator screens 16 with Fresnel lens 40 in lens-coupled DR imaging apparatus 10 according to the present invention, significant additional improvements in optical coupling efficiency can be realized.

Figure 10:
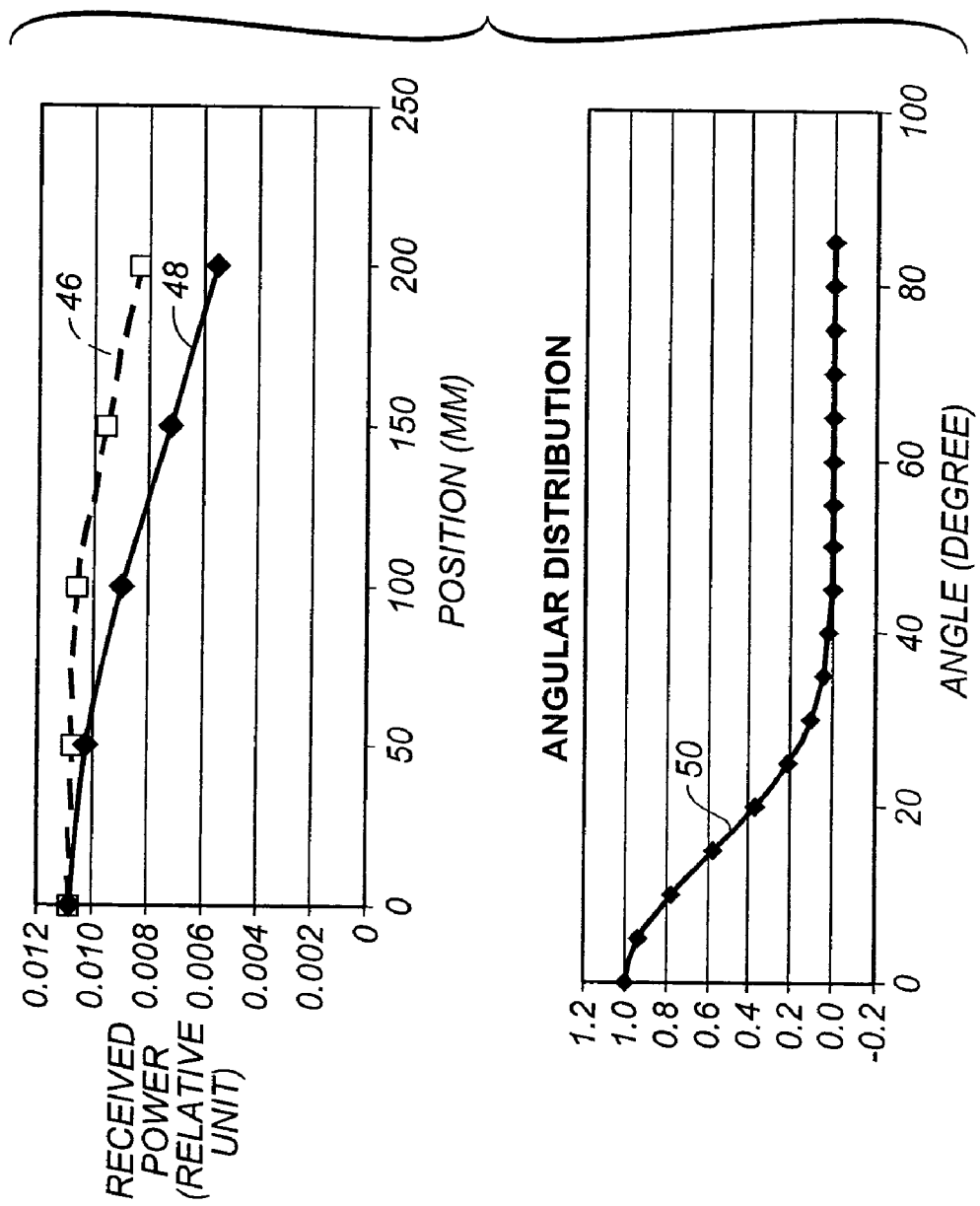
FIG. 10 shows relative optical coupling efficiencies (top graph), with and without the use of Fresnel lens, in DR imaging system with scintillator screen having a Gaussian emission distribution (bottom graph)

Referring now to FIG. 10, there are shown comparative plots (top graph) of optical coupling efficiency when using a scintillator screen 16 having a forward-directed emission distribution that is in the shape of a Gaussian function, with a full-width at half-maximum of 36 degrees, as shown by curve 50 in the bottom graph of FIG. 10. Data for these plots are generated from ray tracing results for a DR system having a lens system 18 with f-number=1 and demagnification factor=7.6. A dotted line curve 46 shows the relative optical coupling efficiency of the DR system with a Fresnel lens 40, as a function of field position. A solid line curve 48 shows relative optical efficiency for the same system without the use of Fresnel 40. Use of Fresnel lens 40 brings about considerable improvements in coupling efficiency.

Suppression of TIR Effects

As was noted with reference to the BEF 26 solutions disclosed in U.S. Pat. No. 6,178,224, TIR has been shown to be detrimental to overall image quality. Depending on the angle of incident light, Fresnel lens 40 as used in the present invention may exhibit some amount of TIR due to its highly angular surface structures. As shown by the ray traces in FIG. 7, for example, Ray R1 has undergone TIR on the surface of draft portion 42 and is directed in an unwanted direction. Ray R2 has undergone TIR twice: once on the inner surface of slope 44 at point T1, then on the flat surface 34 of Fresnel lens 40 at point T2. Ray R2 then exits from the surface of draft portion 42 as stray light. Both R1 and R2 could give rise to unwanted crosstalk if imaged onto image sensing apparatus 20 (not shown).

To avoid loss in image contrast, it is desirable to suppress TIR and its image degradation effects. By proper implementation of the Fresnel lens 40, the present invention can improve light coupling efficiency while suppressing TIR. This is possible in the present invention because it does not make use of recycled TIR light to achieve the coupling increase. It is emphasized again that Polichar et al. '224 suffers from the detrimental effects of TIR on image contrast because it relies on recycled TIR light to bring about the optical coupling increase.

Figure 7:
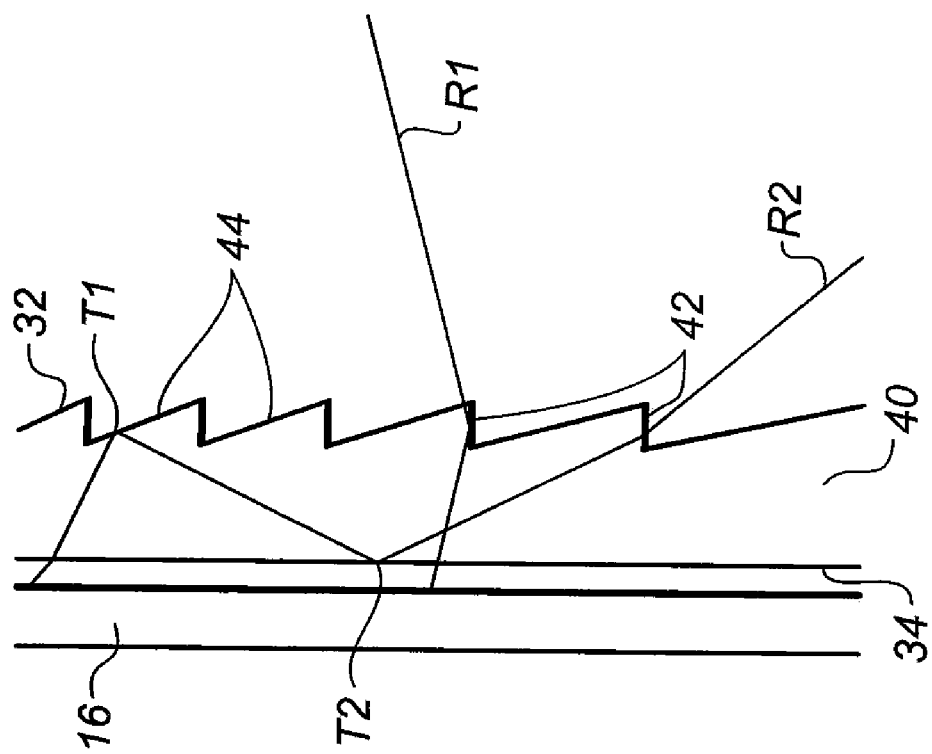
FIG. 7 is a close-up side view showing the paths of various light rays tracing through a Fresnel lens.

In one embodiment of the present invention, Fresnel lens 40 is adapted in order to minimize TIR effects and unwanted transmitted light from draft surfaces as shown in FIG. 7. Referring now to the side cross-sectional view of FIG. 12, each draft portion 42 of Fresnel lens 40 has an opaque coating 36 applied for this purpose. Optionally, the surface of draft 42 can be suitably roughened to reduce its transmissivity. The opaque coating or surface roughening can considerably reduce crosstalk arised from TIR effects.

Figure 8A:
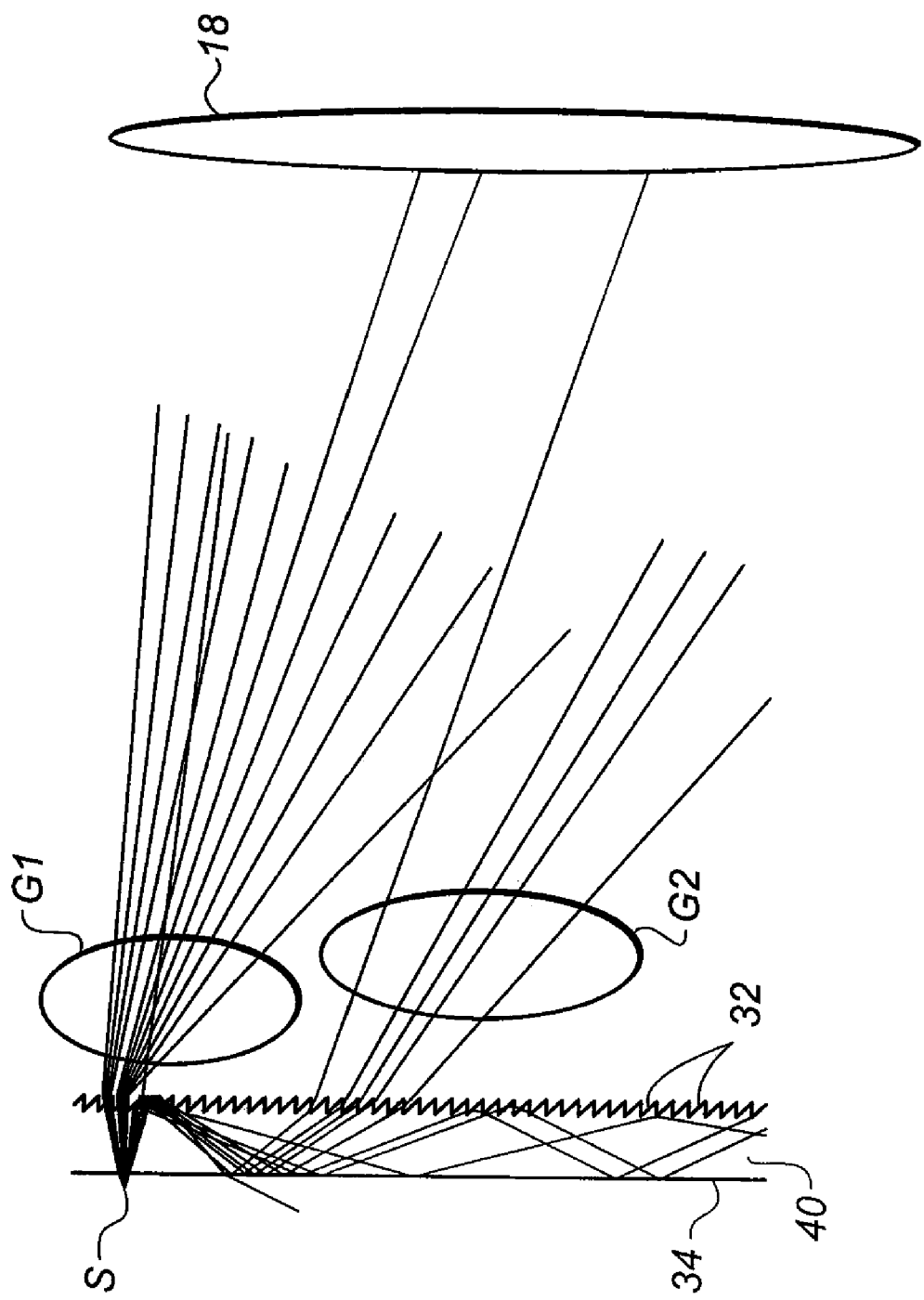
FIG. 8A is a side view showing ray traces through a Fresnel lens oriented with the ridge side facing lens system.

As shown in FIG. 7, one side of Fresnel lens 40 is flat surface 34; the opposite featured side has ridges 32. For the purpose of redirecting incident light from scintillator screen 16, Fresnel lens 40 can be oriented in either of two directions: either with ridges 32 facing toward lens system 18, or with ridges 32 facing toward scintillator screen 16. As shown in FIG. 8A, with ridges 32 facing toward lens system 18, the light from point S propagates to lens system 18 in different paths. Group G1 are rays that are refracted by the slopes of Fresnel lens 40; this group of rays are useful and contain the image-modulated light or signal. However, group G2 of rays are not useful. Group G2 rays are total internal-reflected on internal surfaces of Fresnel lens 40 to exit through draft surfaces of Fresnel lens 40 and can be considered "crosstalk noise" rather than signal. If allowed to propagate through lens system 18, group G2 rays diminish contrast and compromise overall image quality.

In another embodiment of the present invention, as shown in FIG. 8B, Fresnel lens 40 is oriented in the opposite orientation, with ridges 32 facing toward scintillator screen 16. This orientation minimizes crosstalk noise at image sensing apparatus 20 by preventing the TIR rays from propagating through lens system 18. With this arrangement, G4 is the group of useful image data rays that have undergone refraction at the slope surfaces of Fresnel lens 40 and propagate toward lens system 18. Rays that are refracted by the draft surfaces of Fresnel lens 40 and undergo subsequent TIR (as traced out by rays in group G3), however, are directed well away from lens system 18. The unwanted light rays of group G3 are kept from reaching image sensing apparatus 20 and thus do not constitute crosstalk noise. Therefore, there are advantages to embodiments of lens-coupled DR imaging apparatus 10 using this orientation of Fresnel lens 40, with ridges 32 facing scintillator screen 16.

It is noted that when Fresnel lens 40 is oriented with ridges 32 facing scintillator screen 16, optimal image quality is obtained when the pitch between ridges 32 of Fresnel lens 40 is at least twice smaller than the resolution of the screen, for example, 50 μm. This requirement ensures that the transmissivity of Fresnel lens 40 and overall image quality of the system are not compromised.

The invention has been described in detail with particular reference to certain preferred embodiments thereof, but it will be understood that variations and modifications can be effected within the scope of the invention as described above, and as noted in the appended claims, by a person of ordinary skill in the art without departing from the scope of the invention.

Thus, what is provided is an apparatus and method for DR imaging offering improved optical coupling efficiency without degrading contrast.

PARTS LIST 10 conventional lens-coupled DR imaging apparatus
11 lens-coupled DR imaging apparatus with Fresnel lens
12 radiation source
14 subject
16 scintillator screen
18 lens system
20 image sensing apparatus
24 pixel
25 pixel
25' pixel
26 BEF
28 prism
30 light cone
32 ridge
34 flat surface
36 coating
40 Fresnel lens
42 draft portion
44 slope
46 curve
48 curve
50 curve

The invention claimed is:

1. An x-ray imaging system comprising:
   a) a radiation source providing x-ray radiation;
   b) a substrate comprised of a scintillating material responsive to a level of incident radiation from said radiation source and providing output light according to said level of incident radiation;
   c) a first lens disposed proximate said substrate, the first lens directing said output light toward a second lens, said first lens having a flat side opposite a ridged side, said ridged side having a ridge structure facing said scintillating material, the ridge structure directing light undergoing total internal reflection at said flat side and away from said second lens; and
   d) said second lens directing said output light to an image sensor for converting light levels to digital data, forming an image thereby.

2. An x-ray imaging system according to claim 1 wherein draft surfaces of said first lens are treated to suppress transmissivity.

3. An x-ray imaging system according to claim 2 wherein said treatment comprises application of a coating.

4. An x-ray imaging system according to claim 2 wherein said treatment comprises mechanical roughening.

5. An x-ray imaging system according to claim 1 wherein said first lens is affixed to a surface of said substrate.

6. An x-ray imaging system according to claim 1 wherein a pitch of the ridge structure on said first lens is less than or equal to half of a resolution of said substrate.

7. An x-ray imaging system according to claim 1 wherein said substrate provides output light having a forward-directed intensity distribution.

8. The system of claim 1, the ridge structure preventing the light undergoing total internal reflection from propagating through the second lens.

9. The system of claim 1, wherein the output light provided by the substrate and impinging first lens is divergent.

10. The system of claim 1, said ridge structure comprising draft surfaces substantially perpendicular to said flat side and a slope surface adjacent each draft surface, at least one of said slope surfaces refracting said output light toward said second lens.

11. The system of claim 1, said ridge structure comprising draft surfaces substantially perpendicular to said flat side and a slope surface adjacent each draft surface, a majority of said output light directed toward said second lens comprising light refracted by said slope surfaces.

12. An x-ray imaging system comprising:
   a radiation source providing x-ray radiation;
   a substrate comprised of a scintillating material which receives said x-ray radiation on a first surface and produces output light from a second surface, proportional to said x-ray radiation;
   a Fresnel lens having a flat side and a ridge side, said Fresnel lens disposed proximate said second surface, for directing the output light toward a second lens;

wherein said second lens directs said output light to an image sensor for converting said light to digital data, thereby forming an image;

wherein a pitch of a ridge structure on said ridge side of the Fresnel lens is less than or equal to half of a resolution of said substrate, the ridge structure comprising a draft surface substantially perpendicular to the flat side, the draft surface substantially suppressing transmission of output light impinging thereon; and wherein said ridge side of said Fresnel lens is adjacent to said second surface of said substrate, the ridge side directing light undergoing total internal reflection at said flat side and away from said second lens.

13. An x-ray imaging system comprising:

a radiation source providing x-ray radiation;

a substrate comprised of a scintillating material which receives said x-ray radiation on a first surface and produces output light from a second surface, proportional to said x-ray radiation;

a first lens disposed proximate said second surface, for directing the output light toward a second lens;

wherein said first lens is comprised of a flat side and a ridged side;

wherein a ridge structure on said ridged side is rotationally symmetric about a center of said first lens, said ridge structure comprising a draft surface substantially perpendicular to the flat side, the draft surface substantially suppressing transmission of output light impinging thereon, and wherein an angle of ray bending at outer edges of said first lens progressively decreases from said outer edges to said center of said first lens;

wherein said second lens directs said output light to an image sensor for converting said light to digital data, thereby forming an image;

wherein a pitch of said ridge structure on said first lens is less than or equal to half of a resolution of said substrate; and wherein said ridge side of said first lens is adjacent to said second surface of said substrate, the ridge side directing light undergoing total internal reflection at said flat side and away from said second lens.

14. A method of capturing a radiographic image comprising:

providing x-ray radiation;

converting said x-ray radiation to visible light with conversion means comprising a scintillating material;

redirecting said visible light with a first lens, wherein an angle of ray bending at outer edges of said first lens progressively decreases from said outer edges to a center of said first lens;

a side of said first lens being a flat side and opposite that another side being a ridge side, said ridge side having a ridge structure facing said scintillating material, wherein the ridge structure on said first lens is rotationally symmetric about said center of said first lens, the ridge structure directing light undergoing total internal reflection at the flat side and away from an image sensor;

focusing said redirected light to said image sensor; and converting said focus light to digital data, thereby forming a digital image.

15. A method of capturing said radiographic image as in claim 14 wherein a pitch of said ridge structure on said first lens is less than or equal to half of a resolution of said conversion means.

16. A method of capturing said radiographic images as in claim 14 wherein the ridge structure of said first lens is adjacent to a surface of said conversion means.

17. A method of capturing said radiographic image as in claim 14 wherein treating a draft portion of said first lens suppresses transmissivity.

18. A method of capturing said radiographic image as in claim 17 wherein said treatment comprises application of a coating.

19. A method of capturing said radiographic image as in claim 17 wherein said treatment comprises mechanical roughening.

20. A method of capturing said radiographic image as in claim 14 wherein said first lens is affixed to a surface of said conversion means.

21. An x-ray imaging system comprising:

a) a substrate comprised of a scintillating material responsive to a level of incident radiation and providing output light according to said level of incident radiation;

b) a first lens disposed proximate said substrate, the first lens directing said output light toward a second lens, said first lens having a flat side opposite a ridged side, said ridged side having a ridge structure with draft surfaces substantially perpendicular to the flat side and substantially suppressing transmission of output light impinging thereon, said ridged side facing said scintillating material, the ridge structure directing light undergoing total internal reflection at said flat side and away from said second lens; and c) said second lens directing said output light to an image sensor for converting light levels to digital data, forming an image thereby.

* * * * *